United States Patent
Kang

(10) Patent No.: US 9,972,366 B2
(45) Date of Patent: May 15, 2018

(54) SENSE AMPLIFIER FOR HIGH SPEED SENSING, MEMORY APPARATUS AND SYSTEM INCLUDING THE SAME

(71) Applicant: SK hynix Inc., Icheon-si, Gyeonggi-do (KR)

(72) Inventor: Seok Joon Kang, Seoul (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days. days.

(21) Appl. No.: 15/471,246

(22) Filed: Mar. 28, 2017

(65) Prior Publication Data
US 2018/0059938 A1    Mar. 1, 2018

(30) Foreign Application Priority Data
Aug. 29, 2016 (KR) .................. 10-2016-0110116

(51) Int. Cl.
| | | |
|---|---|---|
| *G11C 7/06* | (2006.01) | |
| *G11C 11/16* | (2006.01) | |
| *G11C 13/00* | (2006.01) | |
| *G11C 11/22* | (2006.01) | |

(52) U.S. Cl.
CPC ............ *G11C 7/065* (2013.01); *G11C 7/06* (2013.01); *G11C 11/1673* (2013.01); *G11C 11/2273* (2013.01); *G11C 13/004* (2013.01); *G11C 2013/0045* (2013.01); *G11C 2207/002* (2013.01); *G11C 2207/06* (2013.01)

(58) Field of Classification Search
CPC ...... G11C 7/06; G11C 7/065; G11C 2207/002; G11C 2207/06; G11C 11/1673; G11C 11/2273; G11C 13/004; G11C 2013/0045
See application file for complete search history.

(56) References Cited

U.S. PATENT DOCUMENTS

| | | | | |
|---|---|---|---|---|
| 6,097,638 | A * | 8/2000 | Himeno | G11C 16/26 365/185.21 |
| 7,193,898 | B2 * | 3/2007 | Cernea | G11C 7/02 365/185.17 |
| 7,733,726 | B2 * | 6/2010 | La Rosa | G11C 7/062 365/189.09 |
| 7,817,073 | B2 | 10/2010 | Baker | |
| 8,477,534 | B2 * | 7/2013 | Iwai | G11C 11/5642 365/185.03 |
| 8,908,426 | B2 * | 12/2014 | Wang | G11C 11/5678 365/163 |
| 8,947,924 | B2 | 2/2015 | Li et al. | |
| 9,607,693 | B2 * | 3/2017 | Ogiwara | G11C 13/004 |
| 2016/0267969 | A1 * | 9/2016 | Ogiwara | G11C 13/004 |

* cited by examiner

*Primary Examiner* — Vanthu Nguyen
(74) *Attorney, Agent, or Firm* — William Park & Associates Ltd.

(57) ABSTRACT

A sense amplifier includes a current supply unit, an amplification unit, a pass transistor and a latch unit. The current supply unit may be configured to provide a sensing current to a sensing node. The amplification unit may be configured to amplify a voltage difference between the read reference voltage with the voltage level of the global bit line. The pass transistor may be configured to transfer a current from the sensing node to the global bit line based on a signal output from the amplification unit. The latch unit may be configured to generate an output signal by detecting a voltage level change of the sensing node.

19 Claims, 9 Drawing Sheets

SENSE AMPLIFIER FOR HIGH SPEED SENSING, MEMORY APPARATUS AND SYSTEM INCLUDING THE SAME

CROSS-REFERENCES TO RELATED APPLICATION

The present application claims priority under 35 U.S.C. § 119(a) to Korean application number 10-2016-0110116, filed on Aug. 29, 2016 in the Korean Intellectual Property Office, which is incorporated herein by reference in its entirety.

BACKGROUND

1. Technical Field

Various embodiments may generally relate to a semiconductor technology, and more particularly, to a sense amplifier, memory apparatus and system including the same.

2. Related Art

An electronic device consists of a lot of electronic elements, and a computer system consists of lots of electronic elements comprising semiconductor apparatuses. The computer system consists of a memory apparatus. A dynamic random access memory (DRAM) is widely used as a general memory apparatus since the DRAM has advantages of fast data input/output speed and random access. However, the DRAM consists of a memory cell comprising a capacitor and thus is volatile since the DRAM loses stored data when power supply is cut off. A flash memory apparatus has been proposed in order to overcome the disadvantage of the DRAM. The flash memory apparatus consists of a memory cell comprising a floating gate and thus is nonvolatile since the flash memory apparatus maintains stored data even when power supply is cut off. However, the flash memory apparatus has extremely slower data input/output speed than the DRAM and can hardly support the random access.

Recently, the next-generation memory apparatuses having fast operation speeds and non-volatility are being researched and developed, and examples of the next-generation memory apparatuses consist of a Phase-Change Random Access Memory (PCRAM), a Resistive Random Access Memory (RRAM), a Magnetic Random Access Memory (MRAM), and a Ferroelectric Random Access Memory (FRAM). The next-generation memory apparatuses have advantages consisting of fast operation speeds and non-volatility. Particularly, the PRAM includes a memory cell consisting of chalcogenides and stores data by changing a resistance value of the memory cell.

SUMMARY

According to an embodiment, a system may be provided. According to an embodiment, a memory apparatus may be provided. According to an embodiment, a sense amplifier may be provided. The sense amplifier may include a current supply unit. The sense amplifier may include an amplification unit. The sense amplifier may include a pass transistor. The sense amplifier may include a latch unit. The current supply unit may be configured to provide a sensing current to a sensing node. The amplification unit may be configured to amplify a voltage difference between the read reference voltage with the voltage level of the global bit line. The pass transistor may be configured to transfer a current from the sensing node to the global bit line based on a signal output from the amplification unit. The latch unit may be configured to generate an output signal by detecting a voltage level change of the sensing node.

DETAILED DESCRIPTION

Hereinafter, a semiconductor apparatus according to various embodiments will be described below with reference to the accompanying drawings through examples of embodiments.

Figure 1:
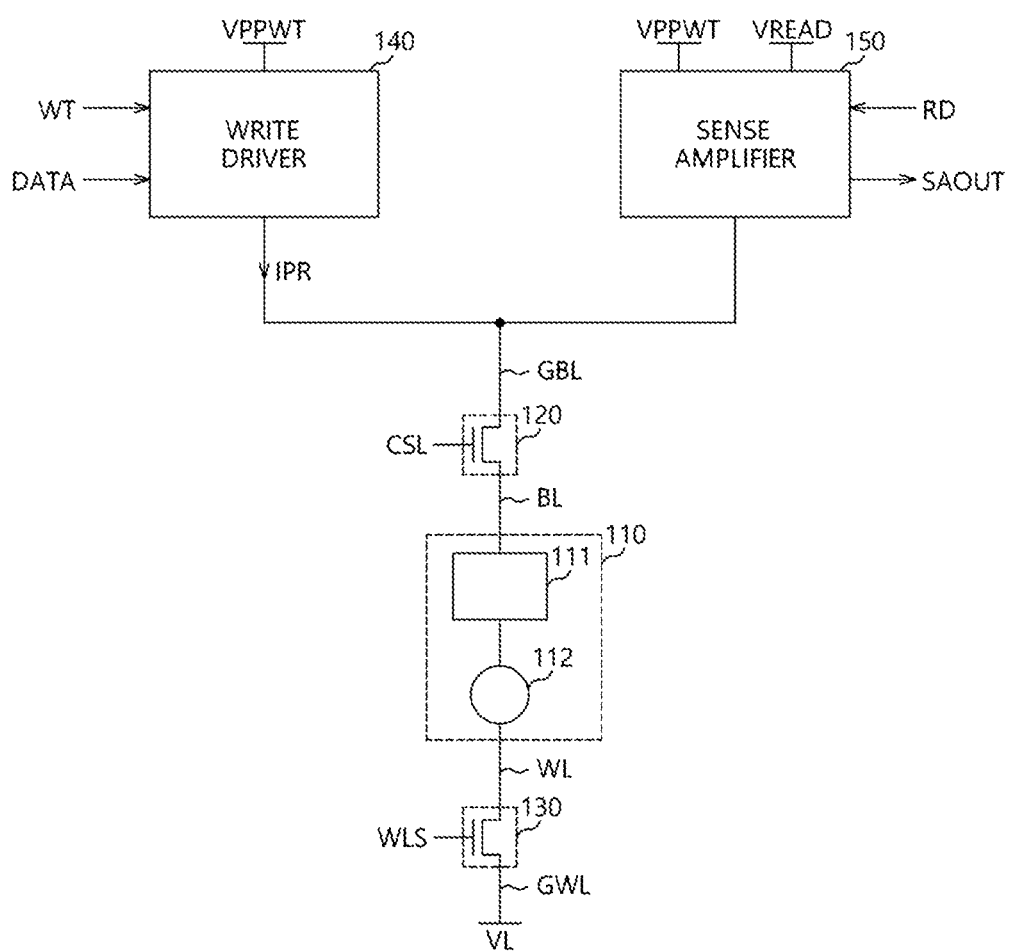
FIG. 1 is a diagram illustrating a non-volatile memory apparatus in accordance with an embodiment.
Figure 2:
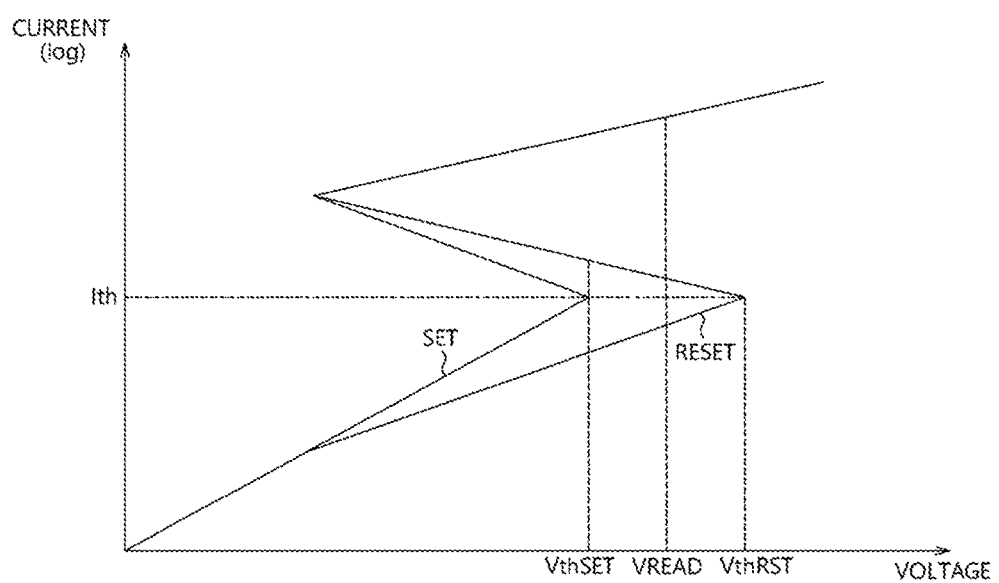
FIG. 2 is a current-voltage graph illustrating a characteristic of a switching element of FIG. 2.

FIG. 1 is a diagram illustrating a non-volatile memory apparatus 1 in accordance with an embodiment. Referring to FIG. 1, the non-volatile memory apparatus 1 may include a memory cell array 110. The memory cell array 110 may include a memory cell 111 and a switching element 112. The memory cell 111 may be composed of a variable resistive material and may store data. For example, the memory cell 111 may have a high resistance status or a low resistance status to store data. The memory cell 111 having the high resistance status may represent to store a reset data, and the memory cell 111 having the low resistance status may represent to store a set data. The switching element 112 may allow a current to flow toward a predetermined direction such as a diode. The switching element 112 may be the Ovonic Threshold Switch (OTS). The Ovonic Threshold Switch may allow a great amount of current to flow through the Ovonic Threshold Switch when a current flowing through the Ovonic Threshold Switch is greater than a threshold current a voltage difference between both ends thereof is greater than a threshold voltage. FIG. 2 is a current-voltage graph illustrating a characteristic of the switching element 112 of FIG. 2. Referring to FIG. 2, the horizontal axis of the graph represents a voltage difference between the both ends of the switching element 112, and the vertical axis of the graph represents a log-scaled amount of a current flowing through the switching element 112. The switching element 112 may stay turned off while a current flowing through the switching element 112 is smaller than a threshold current value Ith or a voltage difference between both ends of the switching element 112 is smaller than a threshold voltage value VthSET. An amount of current flowing through the memory cell 111 may be very small when the switching element 112 stays turned off. When the current flowing through the switching element 112 becomes greater than the threshold current value Ith or a voltage difference between both ends of the switching element 112 becomes greater than the threshold voltage value VthSET as the current flowing through the switching element 112 increases, the switching element 112 may be turned on. When the switching element 112 is turned on, an unlimited amount of current may flow through the memory cell 111. The voltage difference between both ends of the switching element 112 may be the threshold voltage value VthSET when the memory cell 111 has the low resistance status or stores a set data SET, and may be the threshold voltage value VthRST when the memory cell 111 has the high resistance status or stores a reset data RESET. As described later, a read reference voltage VREAD for reading data stored in the memory cell 111 may have a level between levels of the threshold voltage value VthSET and the threshold voltage value VthRST.

Referring to FIG. 1, the non-volatile memory apparatus 1 may include a column switch 120, a row switch 130, a write driver 140 and a sense amplifier 150. The memory cell array 110 may be coupled to a bit line BL at one end thereof, and coupled to a word line WL at the other end thereof. The non-volatile memory apparatus 1 may have hierarchical bit line structure and hierarchical word line structure. The column switch 120 may couple a global bit line GBL to the bit line BL based on a column selection signal CSL. Although not illustrated, the non-volatile memory apparatus 1 may further include a plurality of cell arrays and a plurality of column switches. Each of the plurality of cell arrays and each of the plurality of column switches may be coupled to different bit lines based on a corresponding column selection signal. The column selection signal CSL may represent a particular bit line according to a column address signal. Therefore, the global bit line GBL may be selectively coupled to the plurality of bit lines.

The row switch 130 may couple a global word line GWL to a word line WL based on a word line selection signal WLS. The word line selection signal WLS may be enabled on the basis of a row address signal. When the word line selection signal WLS is enabled, the row switch 130 may couple the word line WL, which is coupled to the other end of the memory cell array 110, to the global word line GWL. Although not illustrated, the non-volatile memory apparatus 1 may further include a plurality of row switches, which are commonly coupled to the global word line GWL. When a particular word line selection signal WLS is enabled, the global word line GWL may be selectively coupled to a cell array, which is coupled to a particular word line. The global word line GWL may be coupled to a node of low voltage VL. The node of low voltage VL may be coupled to a ground voltage and/or a bulk bias voltage. The bulk bias voltage may have a negative level lower than a level of the ground voltage. For example, the node of low voltage VL may be coupled to the ground voltage during a standby mode of the non-volatile memory apparatus 1, and may be coupled to the bulk bias voltage during an active operation of the non-volatile memory apparatus 1, which will not limit the scope of the present disclosure.

The write driver 140 may store data into the memory cell 111 by changing the resistance value of the memory cell 111. The write driver 140 may generate a program current IPR based on a write signal WT and data DATA. The write signal WT may be generated on the basis of a write command that the non-volatile memory apparatus 1 receives from an external apparatus. The data DATA may include a set data and a reset data. The program current IPR may include a set program current and a reset program current. The write driver 140 may generate the program current IPR from a power supply voltage VPPWT. Based on the data DATA, the write driver 140 may generate a set program current for programming the set data into the memory cell 111 and may generate a reset program current form programming the reset data into the memory cell 111. Amplitude of the reset program current may be greater than that of the set program current. The write driver 140 may change the resistance status of the memory cell 111 by providing the program current IPR to the memory cell array 110 through the global bit line GBL.

The sense amplifier 150 may generate an output signal SAOUT by reading stored in the memory cell 111. The sense amplifier 150 may read data stored in the memory cell 111 based on a read signal RD. The read signal RD may be generated on the basis of a read command that the non-volatile memory apparatus 1 receives from an external apparatus. The sense amplifier 150 may provide a current and/or a voltage to the memory cell array 110 through the global bit line GBL based on the read signal RD and the power supply voltage VPPWT. The sense amplifier 150 may generate the output signal SAOUT by comparing the read reference voltage VREAD with a voltage level according to data stored in the memory cell 111 and/or the resistance status of the memory cell 111. Referring to FIG. 2, the read reference voltage VREAD may have a level between levels of the threshold voltage value VthSET and the threshold voltage value VthRST.

Figure 3:
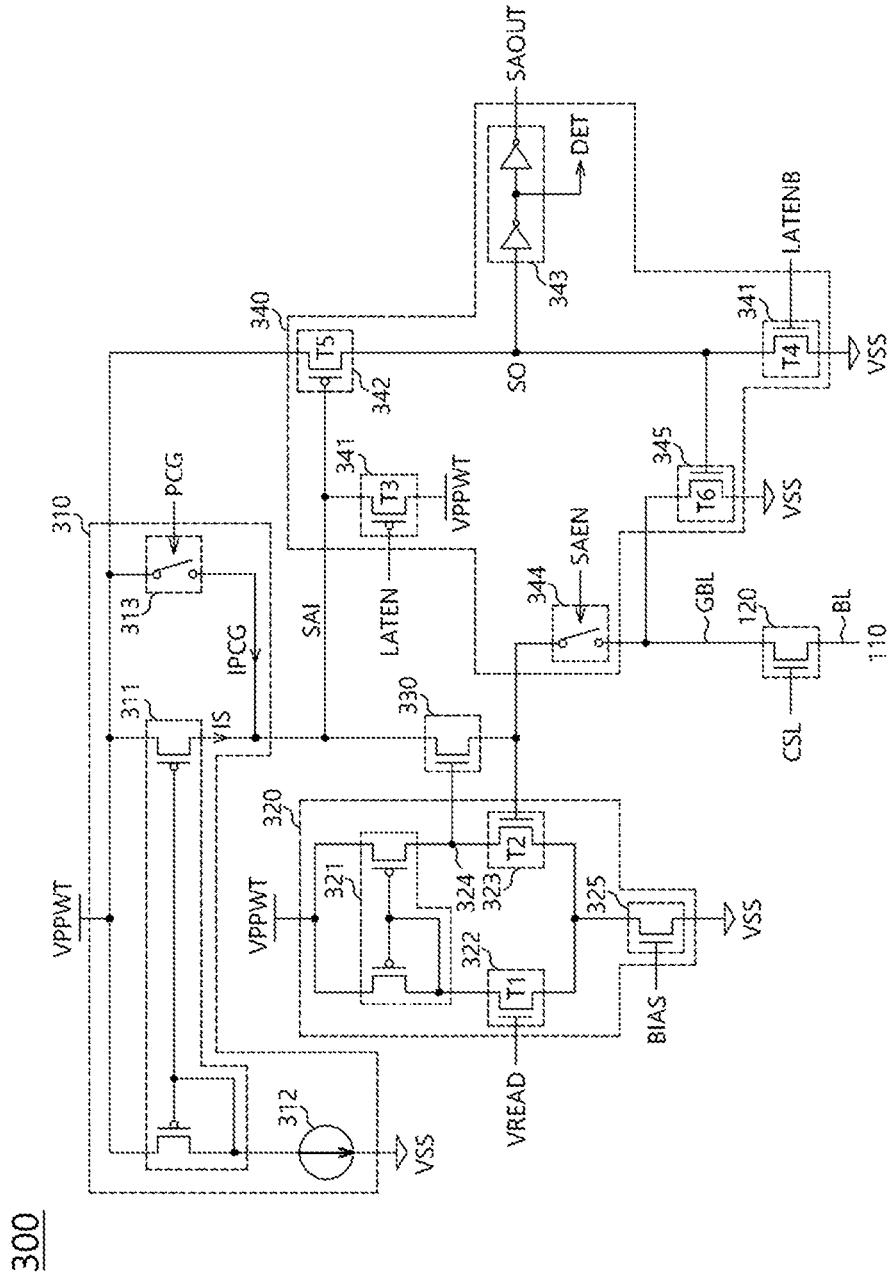
FIG. 3 is a diagram illustrating a sense amplifier in accordance with an embodiment.

FIG. 3 is a diagram illustrating a sense amplifier 300 in accordance with an embodiment. The sense amplifier 300 may correspond to the sense amplifier 150 of FIG. 1. Referring to FIG. 3, the sense amplifier 300 may be coupled to the global bit line GBL, and may be coupled the memory cell 111 through the column switch 120 and bit line BL which are coupled to the global bit line GBL. Referring to FIG. 3, the sense amplifier 300 may include a current supply unit 310, an amplification unit 320, a pass transistor 330 and a latch unit 340. The current supply unit 310 may supply power to the sense amplifier 300 such that the sense amplifier 300 reads data stored in the memory cell 111 of the memory cell array 110. The current supply unit 310 may receive the power supply voltage VPPWT, and provide a sensing current IS to a sensing node SAI. The current supply unit 310 may clamp a current provided to the sensing node SAI such that an excessive current is not provided to the memory cell 111. Further, the current supply unit 310 may perform a precharge operation for a fast sensing operation of the sense amplifier 300. The current supply unit 310 may further receive a precharge signal PCG, and may provide a precharge current IPCG to the sensing node SAI based on the precharge signal PCG. Amplitude of the precharge current IPCG may be greater than that of the sensing current IS.

The amplification unit 320 may receive the read reference voltage VREAD, and may be coupled to the global bit line GBL. The amplification unit 320 may compare voltage levels of the global bit line GBL with the read reference voltage VREAD and amplify a voltage difference between the voltage levels of the global bit line GBL with the read reference voltage VREAD. The amplification unit 320 may include a first input portion 322, a second input portion 323 and an output portion 324. The amplification unit 320 may receive the read reference voltage VREAD through the first input portion 322. The second input portion 323 of the amplification unit 320 may be coupled to the global bit line GBL. The second input portion 323 of the amplification unit 320 may be coupled to the bit line BL and the memory cell array 110 through the global bit line GBL. The voltage level of the global bit line GBL may change according to the resistance status of the memory cell 111 and/or data stored in the memory cell 111 when a current is provided to the memory cell 111 through the global bit line GBL. For example, the global bit line GBL may have relatively lower voltage level when the memory cell 111 has a low resistance status and/or the memory cell 111 stores a set data. For example, the global bit line GBL may have relatively higher voltage level when the memory cell 111 has a high resistance status and/or the memory cell 111 stores a reset data. The amplification unit 320 may output a signal through the output portion 324 by comparing the voltage levels of the global bit line GBL coupled to the second input portion 323 and the read reference voltage VREAD provided through the first input portion 322 and amplifying a voltage difference between the voltage levels of the global bit line GBL coupled to the second input portion 323 and the read reference voltage VREAD provided through the first input portion 322. The amplification unit 320 may be an N typed amplifier, and may output a signal having a relatively lower voltage level through the output portion 324 when the voltage level of the global bit line GBL is higher than that of the read reference voltage VREAD. On the other hand, the amplification unit 320 may output a signal having a relatively higher voltage level through the output portion 324 when the voltage level of the global bit line GBL is lower than that of the read reference voltage VREAD.

The pass transistor 330 may be coupled to the amplification unit 320. The pass transistor 330 may be coupled to the output portion 324 and the second input portion 323 of the amplification unit 320. The pass transistor 330 may transfer a current from the sensing node SAI to the global bit line GBL in response to a signal output from the output portion 324 of the amplification unit 320. The pass transistor 330 may couple the sensing node SAI to the second input portion 323 of the amplification unit 320 and the global bit line GBL in response to the signal output from the output portion 324 of the amplification unit 320. The pass transistor 330 may transfer a greater amount of current from the sensing node SAI to the global bit line GBL as the voltage level of the global bit line GBL becomes lower. The pass transistor 330 may transfer a smaller amount of current from the sensing node SAI to the global bit line GBL as the voltage level of the global bit line GBL becomes higher. The pass transistor 330 may be the N channel MOS transistor. The pass transistor 330 may have a gate coupled to the output portion 324 of the amplification unit 320, a drain coupled to the sensing node SAI, and a source coupled to the second input portion 323 of the amplification unit 320. The global bit line GBL may be coupled to the second input portion 323 of the amplification unit 320 and the source of the pass transistor 330, and may be coupled to the bit line BL and the memory cell array 110 coupled to the bit line BL through the column switch 120. The column switch 120 may couple the memory cell array 110 to the global bit line GBL in response to the column selection signal CSL.

The latch unit 340 may output the output signal SAOUT by detecting the voltage level of the sensing node SAI. When a latch enable signal LATEN is enabled, the latch unit 340 may detect the voltage level of the sensing node SAI, latch the detection result, and output the output signal SAOUT. The latch unit 340 may couple the second input portion 323 of the amplification unit 320 to the global bit line GBL based on a sensing enable signal SAEN. The latch unit 340 may generate a detection signal DET based on the output signal SAOUT. The latch unit 340 may disable the sensing enable signal SAEN based on the output signal SAOUT. The latch unit 340 may block current supply to the global bit line GBL based on the output signal SAOUT. The latch unit 340 may generate the detection signal DET having an opposite level to that of the output signal SAOUT. For example, the latch unit 340 may disable the sensing enable signal SAEN based on the output signal SAOUT when the memory cell 111 has the low resistance status and/or the memory cell 111 stores a set data.

Referring to FIG. 3, the current supply unit 310 may include a current mirror 311 and a clamping current source 312. The current mirror 311 may provide the sensing current IS to the sensing node SAI by receiving the power supply voltage VPPWT. The current supply unit 310 may adjust an amount of the sensing current IS through the clamping current source 312. The clamping current source 312 may be a variable current source, and may be coupled between the current mirror 311 and the ground voltage VSS. The current supply unit 310 may adjust an amount of the sensing current IS by adjusting an amount of current flowing through the clamping current source 312. The current supply unit 310 may further include a precharge switch 313. The precharge switch 313 may couple the sensing node SAI to the power supply voltage VPPWT by receiving the precharge signal PCG. Therefore, the precharge current IPCG may be provided to the sensing node SAI through the precharge switch 313. The precharge switch 313 may control the current supply unit 310 to provide the precharge current IPCG such that the global bit line GBL is provided with a sufficient amount of charge. Through the precharge operation, the sense amplifier 300 may perform the sensing operation much faster.

The amplification unit 320 may include a current mirror 321, the first input portion 322, the second input portion 323 and the output portion 324. The current mirror 321 may be coupled to the power supply voltage VPPWT, and may provide the first input portion 322 and the second input portion 323 with a current of the same amount. The first input portion 322 may include a first transistor T1. The first transistor T1 may be the N channel MOS transistor. The first transistor T1 may have a gate for receiving the read reference voltage VREAD, a drain coupled to the current mirror 321, and a source coupled to the ground voltage VSS. The second input portion 323 may include a second transistor T2. The second transistor T2 may be the N channel MOS transistor. The second transistor T1 may have a gate coupled to the pass transistor 330 and the global bit line GBL, a drain coupled to the output portion 324, and a source coupled to the ground voltage VSS. The amplification unit 320 may further include an enablement portion 325. The enablement portion 325 may form a current path between the first and second input portions 322 and 323 and the ground voltage VSS. The enablement portion 325 may include a transistor for receiving a bias voltage BIAS, and may couple the sources of the first transistor T1 and the second transistor T2 to the ground voltage VSS when the bias voltage BIAS is applied.

The latch unit 340 may include a disablement portion 341, a detection portion 342 and an output portion 343. The disablement portion 341 may disable the latch unit 340 based on the latch enable signal LATEN. When the latch enable signal LATEN is disabled, the disablement portion 341 may turn the detection portion 342 off and may discharge an output node SO to the ground voltage VSS in order for the latch unit 340 not to operate. When the latch enable signal LATEN is enabled, the disablement portion 341 may control the detection portion 342 to change a voltage level of the output node SO according to the voltage level of the sensing node SAI. The disablement portion 341 may include a third transistor T3 and a fourth transistor T4. The third transistor T3 may be the P channel MOS transistor. The third transistor T3 may have a gate for receiving the latch enable signal LATEN, a source coupled to the sensing node SAI, and a drain for receiving the power supply voltage VPPWT. The fourth transistor T4 may be the N channel MOS transistor. The fourth transistor T4 may have a gate for receiving an inverse signal LATENB of the latch enable signal LATEN, a drain coupled to the output node SO, and a source coupled to the ground voltage VSS.

The detection portion 342 may change the voltage level of the output node SO by detecting the voltage level of the sensing node SAI. The detection portion 342 may include a fifth transistor T5. The fifth transistor T5 may be the P channel MOS transistor. The fifth transistor T5 may have a gate coupled to the sensing node SAI, a source for receiving the power supply voltage VPPWT, and a drain coupled to the output node SO. The detection portion 342 may maintain the voltage level of the output node SO to a low level when the voltage level of the sensing node SAI is a high level, and may change the voltage level of the output node SO to a high level by driving the output node SO with the power supply voltage VPPWT when the voltage level of the sensing node SAI is a low level.

The output portion 343 may generate the detection signal DET and the output signal SAOUT by buffering the voltage level of the output node SO. The output portion 343 may include a plurality of inverters. The output portion 343 may generate the detection signal DET having a voltage level opposite to that of the output node SO, and the output signal SAOUT having a logic level corresponding to the voltage level of the output node SO.

The latch unit 340 may further include a current switch 344 and a discharge portion 345. The current switch 344 may couple the second input portion 323 of the amplification unit 320 to the global bit line GBL in response to the sensing enable signal SAEN. The current switch 344 may block current supply to the global bit line GBL through the pass transistor 330 in response to the output signal SAOUT. For example, the current switch 344 may couple the second input portion 323 to the global bit line GBL when the sensing enable signal SAEN is enabled to a high level, and may de-couple the second input portion 323 from the global bit line GBL when the sensing enable signal SAEN is disabled to a low level. The sensing enable signal SAEN may be disabled on the basis of the detection signal DET. For example, the sensing enable signal SAEN may be disabled on the basis of the detection signal DET when the output node SO and the output signal SAOUT have high levels.

The discharge portion 345 may discharge the global bit line GBL based on the voltage level of the output node SO. That is, the discharge portion 345 may discharge the global bit line GBL based on the detection result of the detection portion 342. The discharge portion 345 may include a sixth transistor T6. The sixth transistor T6 may be the N channel MOS transistor. The sixth transistor T6 may have a gate coupled to the output node SO, a drain coupled to the global bit line GBL, and a source coupled to the ground voltage VSS. For example, the discharge portion 345 may not discharge the global bit line GBL when the voltage level of the output node SO is a low level, and may discharge the global bit line GBL to the ground voltage VSS when the voltage level of the output node SO is a high level.

Figure 4:
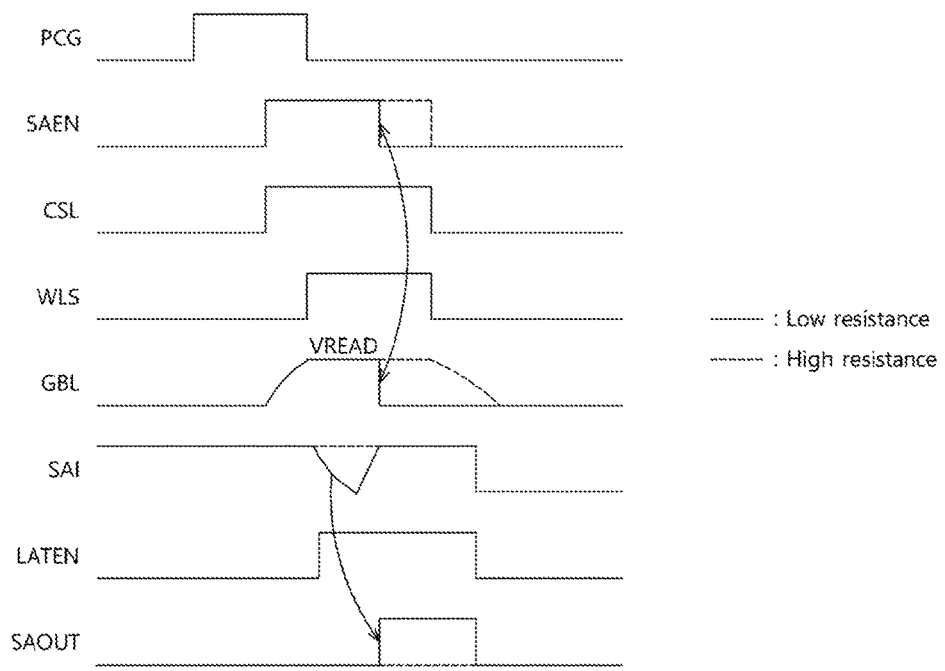
FIG. 4 is a timing diagram illustrating an operation of a sense amplifier in accordance with an embodiment.

FIG. 4 is a timing diagram illustrating an operation of a sense amplifier in accordance with an example of an embodiment of the present disclosure. Hereinafter, described with reference to FIGS. 1 to 4 will be the operation of the sense amplifier 300 in accordance with an example of an embodiment of the present disclosure. When the non-volatile memory apparatus 1 receives a read command from an external device, the read signal RD is enabled and the sense amplifier 300 may read data stored in the memory cell 111. When the read signal RD is enabled, the precharge signal PCG may be enabled. The precharge switch 313 may be turned on and may couple the sensing node SAI to the power supply voltage VPPWT in response to the precharge signal PCG. Therefore, the precharge current IPCG may be provided from the current supply unit 310 to the sensing node SAI. Then, the sensing enable signal SAEN and the column selection signal CSL may be enabled. When the sensing enable signal SAEN is enabled, the second input portion 323 of the amplification unit 320 and the pass transistor 330 may be coupled to the global bit line GBL. Therefore, a current may be provided to the global bit line GBL through the pass transistor 330. The global bit line GBL may be charged according to the current provided from the sensing node SAI through the pass transistor 330, and the voltage level of the global bit line GBL may rise to a level corresponding to the read reference voltage VREAD. At this time, the sensing node SAI is provided with the precharge current IPCG and thus the voltage level of the global bit line GBL may rise rapidly. Further, the memory cell 111 of the memory cell array 110 may be coupled to the global bit line GBL in response to the column selection signal CSL. Then the word line selection signal WLS may be enabled. When the word line selection signal WLS may be enabled, the memory cell 111 may be coupled to the node of low voltage VL through the global word line GWL. At the time when the word line selection signal WLS is enabled, the precharge signal PCG may be disabled. Therefore, the current supply unit 310 may provide the sensing current IS to the sensing node SAI.

FIG. 4 illustrates a solid line representing the memory cell 111 having the low resistance status or the memory cell 111 storing a set data, and a dotted line representing the memory cell 111 having the high resistance status or the memory cell 111 storing a reset data. A current may flow through the memory cell 111 as the memory cell 111 is coupled to the global bit line GBL and the global word line GWL. At this time, when the memory cell 111 has the low resistance status, the voltage level of the global bit line GBL may be lower than that of the read reference voltage VREAD and a voltage level of a signal output from the output portion 324 of the amplification unit 320 may gradually rise. Therefore, the pass transistor 330 may form a greater current path, and a relatively greater amount of current may be provided to the global bit line GBL through the pass transistor 330. On the other hand, when the memory cell 111 has the high resistance status, the voltage level of the global bit line GBL may be higher than that of the read reference voltage VREAD and the voltage level of the signal output from the output portion 324 of the amplification unit 320 may gradually falls. Therefore, the pass transistor 330 may form a smaller current path, and a relatively smaller amount of current may be provided to the global bit line GBL through the pass transistor 330. The pass transistor 330 may change an amount of current provided to the memory cell 111 according to the resistance status of the memory cell 111 in consideration of characteristics of the switching element 112 coupled to the memory cell 111. When the memory cell 111 has the low resistance status, the global bit line GBL may be provided with a greater amount of current. Therefore, the switching element 112 may be easily provided with a current greater than the threshold current Ith, and may be turned on such that a great amount of current drastically flows through the memory cell 111.

When the latch enable signal LATEN is enabled, the third and fourth transistors T3 and T4 of the disablement portion 341 may be turned off. The detection portion 342 may change the voltage level of the output node SO by detecting the voltage level of the sensing node SAI. When the memory cell 111 has the low resistance status, the detection portion 342 may provide the power supply voltage VPPWT to the output node SO by detecting falling of the voltage level of the sensing node SAI and the voltage level of the sensing node SAI may become a high level. The output portion 343 may generate the output signal SAOUT having a high level according to the voltage level of the output node SO. At this time, the output portion 343 may disable the sensing enable signal SAEN by generating the detection signal DET. When the sensing enable signal SAEN is disabled, the current switch 344 may be turned off. Therefore, additional current supply to the global bit line GBL through the sensing node SAI and the pass transistor 330 may be blocked. Further, when the voltage level of the output node SO becomes a high level, the discharge portion 345 may be turned on and may discharge the global bit line GBL. A current flowing through the memory cell 111 may decrease as the voltage level of the global bit line GBL falls. Therefore, an excessive current may be prevented from flowing through the memory cell 111 and thus durability of the memory cell 111 may be maintained.

When the memory cell 111 has the high resistance status, the voltage level of the sensing node SAI may be maintained and the detection portion 342 may be turned off. Therefore, the voltage level of the output node SO may stay to a low level and the output portion 343 may generate the output signal SAOUT having a low level. The sensing enable signal SAEN may stay enabled when the output signal SAOUT has a low level, and may be disabled at the time when the column selection signal CSL and the word line selection signal WLS are disabled.

Figure 5:
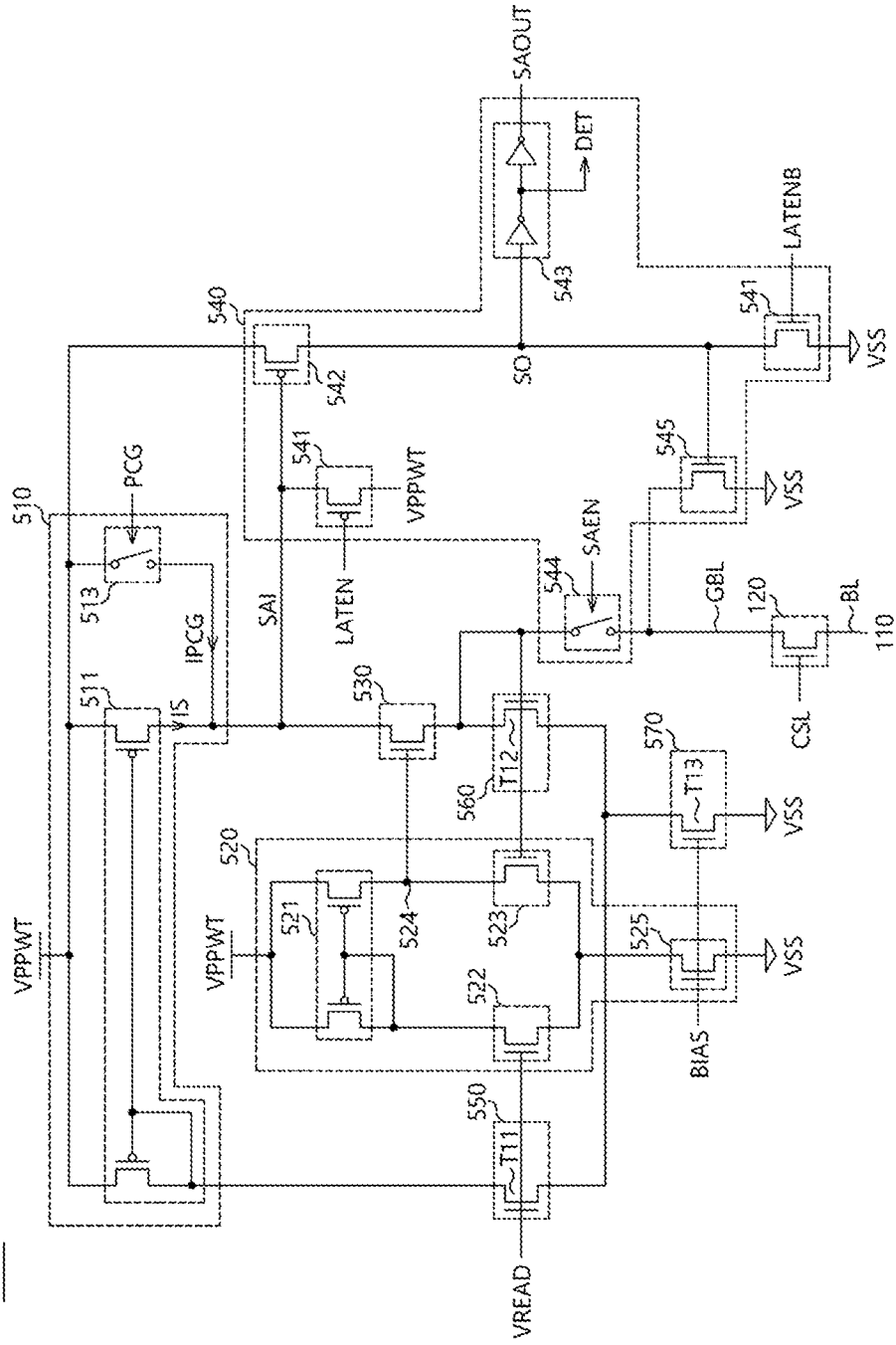
FIG. 5 is a diagram illustrating a sense amplifier in accordance with an embodiment.

FIG. 5 is a diagram illustrating a sense amplifier 500 in accordance with an example of an embodiment of the present disclosure. The sense amplifier 500 may correspond to the sense amplifier 150 of FIG. 1. Referring to FIG. 5, the sense amplifier 500 may include a current supply unit 510, a first current clamping unit 550, an amplification unit 520, a pass transistor 530 and a latch unit 540. The current supply unit 510 may provide a sensing current IS to a sensing node SAI. The current supply unit 510 may provide a precharge current IPCG to the sensing node SAI based on a precharge signal PCG. The first current clamping unit 550 may adjust an amount of the sensing current IS based on a read reference voltage VREAD. That is, the first current clamping unit 550 may clamp the sensing current IS provided by the current supply unit 510. The current supply unit 510 may include a current mirror 511 and a precharge switch 513. The current mirror 511 may receive the power supply voltage VPPWT, and may provide the first current clamping unit 550 and the sensing node SAI with a current of the same amount. The precharge switch 513 may provide the precharge current IPCG to the sensing node SAI based on the precharge signal PCG. When the precharge signal PCG is enabled, the precharge switch 513 may provide the power supply voltage VPPWT to the sensing node SAI. The first current clamping unit 550 may couple the current mirror 511 to a ground voltage VSS based on the read reference voltage VREAD, and thus the sensing current IS provided by the current supply unit 510 may be clamped by the first current clamping unit 550. The first current clamping unit 550 may include a eleventh transistor T11. The eleventh transistor T11 may be the N channel MOS transistor. The eleventh transistor T11 may have a gate for receiving the read reference voltage VREAD, a drain coupled to the current mirror 511, and a source coupled to the ground voltage VSS.

The sense amplifier 500 may further include a second current clamping unit 560 and a current sink unit 570. The second current clamping unit 560 may clamp the sensing current IS based on the voltage level of the global bit line GBL. The current sink unit 570 may form a current path between the first and second current clamping units 550 and 560 and the ground voltage VSS by coupling the first and second current clamping units 550 and 560 to the ground voltage VSS based on a bias voltage BIAS. The second current clamping unit 560 may include a twelfth transistor T12. The twelfth transistor T12 may be the N channel MOS transistor. The twelfth transistor T12 may have a gate coupled to the global bit line GBL, a drain coupled to the global bit line GBL, and a source coupled to the ground voltage VSS. The current sink unit 570 may include a thirteenth transistor T13. The thirteenth transistor T13 may be the N channel MOS transistor. The thirteenth transistor T13 may have a gate for receiving the bias voltage BIAS, a drain commonly coupled to the sources of the eleventh transistor T11 and the twelfth transistor T12, and a source coupled to the ground voltage VSS.

The amplification unit 520 may receive the read reference voltage VREAD, and may be coupled to the global bit line GBL. The amplification unit 520 may compare the voltage levels of the global bit line GBL and the read reference voltage VREAD, and may amplify a voltage difference between the voltage levels of the global bit line GBL and the read reference voltage VREAD. The amplification unit 520 may include a current mirror 521, a first input portion 522, a second input portion 523 and an output portion 524. The current mirror 521 may be coupled to the power supply voltage VPPWT, and may provide the first and second input portions 522 and 523 with a current of the same amount. The first input portion 522 may receive the read reference voltage VREAD. The second input portion 523 may be coupled to the global bit line GBL. The output portion 524 may be coupled to the pass transistor 530. The amplification unit 520 may further include an enablement portion 525. The enablement portion 525 may form a current path between the first and second input portions 522 and 523 and the ground voltage VSS by receiving the bias voltage BIAS.

The pass transistor 530 may couple the sensing node SAI to the second input portion 523 of the amplification unit 520 and the global bit line GBL in response to the signal output from the output portion 524 of the amplification unit 520. The pass transistor 530 may change an amount of current transferred from the sensing node SAI to the output portion 524 of the amplification unit 520 and the global bit line GBL based on the signal output from the output portion 524 of the amplification unit 520. The global bit line GBL may be coupled to a bit line BL and the memory cell array 110 through the column switch 120. The column switch 120 may couple the global bit line GBL to the memory cell 111 of the memory cell array 110 when the column selection signal CSL is enabled.

The latch unit 540 may output an output signal SAOUT by detecting the voltage level of the sensing node SAT. When the latch enable signal LATEN is enabled, the latch unit 540 may detect the voltage level of the sensing node SAT. When the latch enable signal LATEN is disabled, the latch unit 540 may be disabled. When a sensing enable signal SAEN is enabled, the latch unit 540 may couple the second input portion 523 to the global bit line GBL and may disable the sensing enable signal SAEN based on the output signal SAOUT. The latch unit 540 may generate a detection signal DET having an opposite level to that of the output signal SAOUT, and may disable the sensing enable signal SAEN based on the detection signal DET. For example, the latch unit 540 may disable the sensing enable signal SAEN when the memory cell 111 is detected to have the low resistance status and/or the memory cell 111 is detected to store a set data. When the output signal SAOUT has a high level, the latch unit 540 may generate the detection signal DET having a low level and may disable the sensing enable signal SAEN based on the detection signal DET. When the sensing enable signal SAEN is disabled, the latch unit 540 may de-couple the second input portion 523 from the global bit line GBL. Therefore, current supply to the global bit line GBL through the pass transistor 530 may be blocked. By detecting the voltage level of the sensing node SAI, the latch unit 540 may discharge the global bit line GBL when the memory cell 111 is detected to have the low resistance status and the output signal SAOUT becomes to have a high level. Therefore, the voltage level of the global bit line GBL may fall and an excessive current may be prevented from flowing through the memory cell 111.

The latch unit 540 may include a disablement portion 541, a detection portion 542, an output portion 543, a current switch 544 and a discharge portion 545. When the latch enable signal LATEN is disabled, the disablement portion 541 may disable the latch unit 540 in order for the latch unit 540 not to detect the voltage level of the sensing node SAI. When the latch enable signal LATEN is enabled, the disablement portion 541 may be turned off in order for the latch unit 540 to detect the voltage level of the sensing node SAI. The detection portion 542 may change the voltage level of the output node SO by detecting the voltage level of the sensing node SAI. For example, the detection portion 542 may drive the output node SO with the power supply voltage VPPWT when the voltage level of the sensing node SAI is a low level, and may not drive the output node SO when the voltage level of the sensing node SAI is a high level. The output portion 543 may generate the output signal SAOUT by buffering the voltage level of the output node SO. Further, the output portion 543 may generate the detection signal DET having an opposite level to that of the output signal SAOUT.

The current switch 544 may receive the sensing enable signal SAEN. When the sensing enable signal SAEN is enabled, the current switch 544 may be turned on and may couple the second input portion 523 to the global bit line GBL. When the sensing enable signal SAEN is disabled, the current switch 544 may be turned off and may de-couple the second input portion 523 from the global bit line GBL. The discharge portion 545 may couple the global bit line GBL to the ground voltage VSS based on the voltage level of the output node SO. When turned on, the discharge portion 545 may discharge the global bit line GBL.

Hereinafter, described with reference to FIGS. 1, 4 and 5 will be the operation of the sense amplifier 500 in accordance with an example of an embodiment of the present disclosure. When the precharge signal PCG is enabled, the precharge switch 513 may provide the precharge current IPCG to the sensing node SAI. When the sensing enable signal SAEN is enabled, the current switch 544 may be turned on and the sensing node SAI may be coupled to the global bit line GBL through the pass transistor 530. Therefore, the global bit line GBL may be charged by the precharge current IPCG provided to the sensing node SAI and the voltage level of the global bit line GBL may rise. When the column selection signal CSL is enabled, the bit line BL and the memory cell array 110 coupled to the bit line BL may be coupled to the global bit line GBL. Then, when the word line selection signal WLS is enabled, the memory cell array 110 may be coupled to the node of low voltage VL and the precharge signal PCG may be disabled. As the precharge signal PCG is disabled, the precharge switch 513 may be turned off and the current supply unit 510 may provide the sensing current IS to the sensing node SAI. At this time, the sensing current IS may be clamped by the first current clamping unit 550.

When the memory cell 111 has the low resistance status, the voltage level of the global bit line GBL provided to the second input portion 523 may become lower than that of the read reference voltage VREAD and the voltage level of the output portion 524 may become relatively higher. Therefore, the pass transistor 530 may provide the global bit line GBL with a relatively greater amount of current. As a current flowing through the second current clamping unit 560 also becomes smaller, an amount of a current provided to the global bit line GBL may become much greater. The global bit line GBL may be easily provided with a current greater than the threshold current Ith and the switching element 112 may be turned on. A current of a great amount may drastically flow through the memory cell 111 and the switching element 112. Accordingly, the voltage level of the sensing node SAI may fall. When the latch enable signal LATEN is enabled, the detection portion 542 may detect falling of the voltage level of the sensing node SAI and may drive the output node SO with the power supply voltage VPPWT. The output portion 543 may generate the output signal SAOUT having a high level according to the voltage level of the output node SO. Further, the output portion 543 may disable the sensing enable signal SAEN by generating the detection signal DET having a low level. When the sensing enable signal SAEN is disabled, the current switch 544 may be turned off and the second input portion 523 may be de-coupled from the global bit line GBL. Therefore, current supply to the global bit line GBL through the pass transistor 530 may be blocked. Further, the discharge portion 545 may be turned on according to the voltage level of the output node SO, and may discharge the global bit line GBL. Therefore, the voltage level of the global bit line GBL may fall and a current provided to the memory cell 111 may be reduced. As described above, the sense amplifier 500 may reduce the sensing operation time by rapidly detecting that the memory cell 111 has the low resistance status or the memory cell 111 stores a set data, and may reduce an amount of current flowing through the memory cell 111 when the sensing operation is completed, which improves the durability of the memory cell 111.

When the memory cell 111 has the high resistance status, the voltage level of the global bit line GBL provided to the second input portion 523 may become higher than that of the read reference voltage VREAD and the voltage level of the output portion 524 may become relatively lower. Therefore, the pass transistor 530 may provide the global bit line GBL with a relatively smaller amount of current. As a current flowing through the second current clamping unit 560 also becomes greater, an amount of a current provided to the global bit line GBL may become much smaller. The global bit line GBL may be provided with a current less than the threshold current Ith and the switching element 112 may stay turned off. Accordingly, a current of a small amount may flow through the memory cell 111 and the switching element 112. Accordingly, the voltage level of the sensing node SAI may be maintained, and the detection portion 542 may not drive the output node SO with the power supply voltage VPPWT. The output portion 543 may generate the output signal SAOUT having a low level according to the voltage level of the output node SO. At this time, a current of a great amount may not flow through the memory cell 111 and the switching element 112 even when the second input portion 523 is not de-coupled from the global bit line GBL. The sensing enable signal SAEN may be disabled at the time when the column selection signal CSL and the word line selection signal WLS are disabled.

Figure 6:
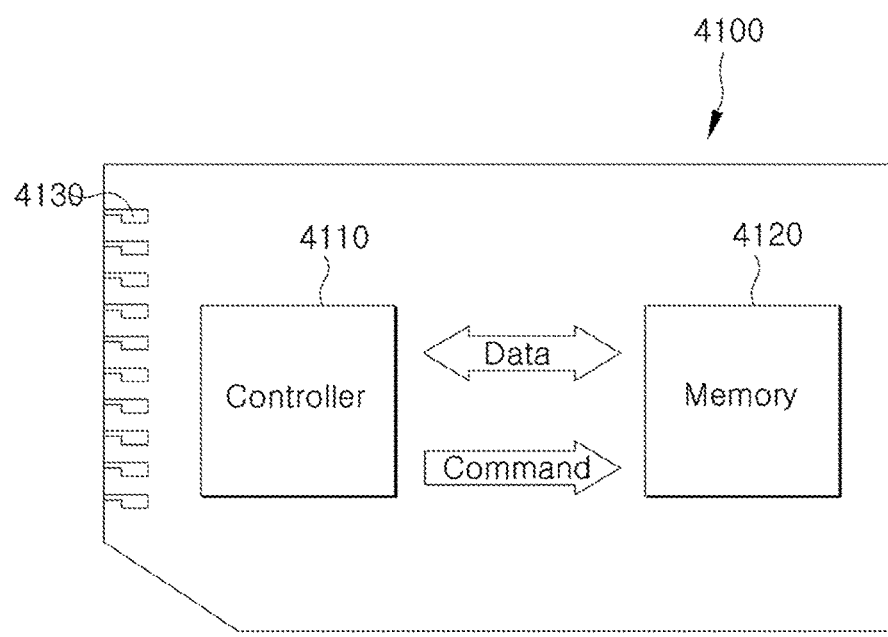
FIG. 6 is a schematic diagram illustrating a memory card 4100 including a nonvolatile memory apparatus in accordance with various embodiments.

FIG. 6 is a schematic diagram illustrating a non-volatile memory card 4100 including a memory apparatus in accordance with various embodiments. Referring to FIG. 6, the memory card system 4100 may include a controller 4110, a memory 4120 and an interface member 4130. The controller 4110 and the memory 4120 may be configured to exchange a command and/or data. For example, the memory 4120 may be used to store a command, which is executed by the controller 4110, and/or user data.

The memory card system 4100 may store data into the memory 4120 or output data to an external from the memory 4120. The memory 4120 may include the non-volatile memory apparatus 1 in accordance with various embodiments.

The interface member 4130 may configured to transfer data from/to an external. The memory card system 4100 may be a multimedia card (MMC), a secure digital card (SD) or a portable data storage device.

Figure 7:
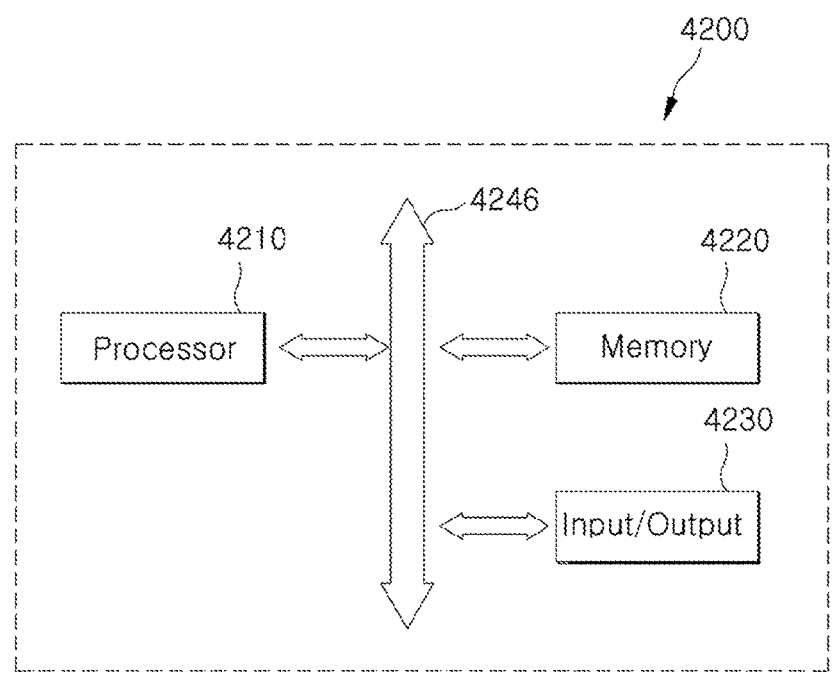
FIG. 7 is a block diagram illustrating an electronic device 4200 including a non-volatile memory apparatus in accordance with various embodiments.

FIG. 7 is a block diagram illustrating an electronic device 4200 including a non-volatile memory apparatus in accordance with various embodiments. Referring to FIG. 7, the electronic device 4200 may include a processor 4210, a memory 4220 and an input and output (input/output) device 4230. The processor 4210, the memory 4220 and the input/output device 4230 may be coupled to one another through a bus 4246.

The memory 4220 may receive a control signal from the processor 4210. The memory 4220 may be used to store code and data for the operation of the processor 4210. The memory 4220 may be used to store data, which is accessed through the bus 4246. The memory 4220 may include the non-volatile memory apparatus 1 in accordance with various embodiments. Additional circuits and control signals may be provided for implementations and modifications of the present disclosure.

The electronic device 4200 may be included in various electronic control devices requiring the memory 4220. For example, the electronic device 4200 may be used in a personal digital assistant (PDA), a laptop computer, a portable computer, a web tablet, a wireless phone, a portable phone, a digital music player, a MP3 player, a navigation, a solid state disk (SSD), a household appliance, or any device capable of wireless communication.

Figure 8:
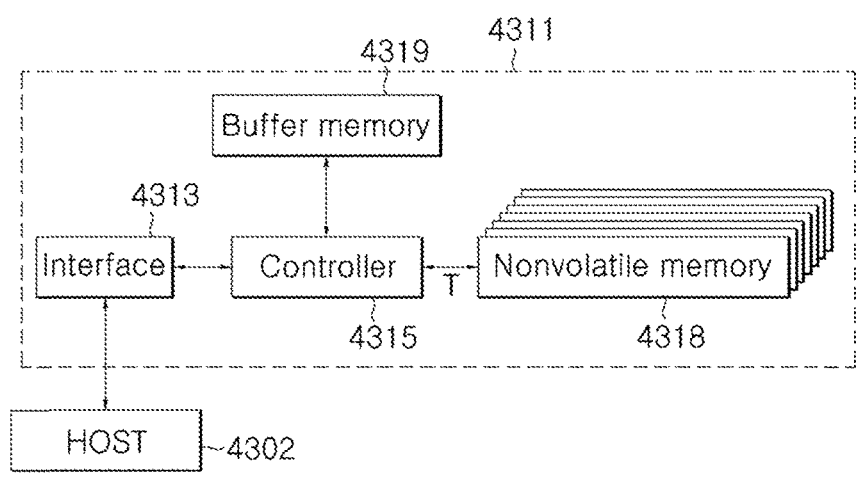
FIG. 8 is a block diagram illustrating a data storage device including a non-volatile memory apparatus in accordance with various embodiments.
Figure 9:
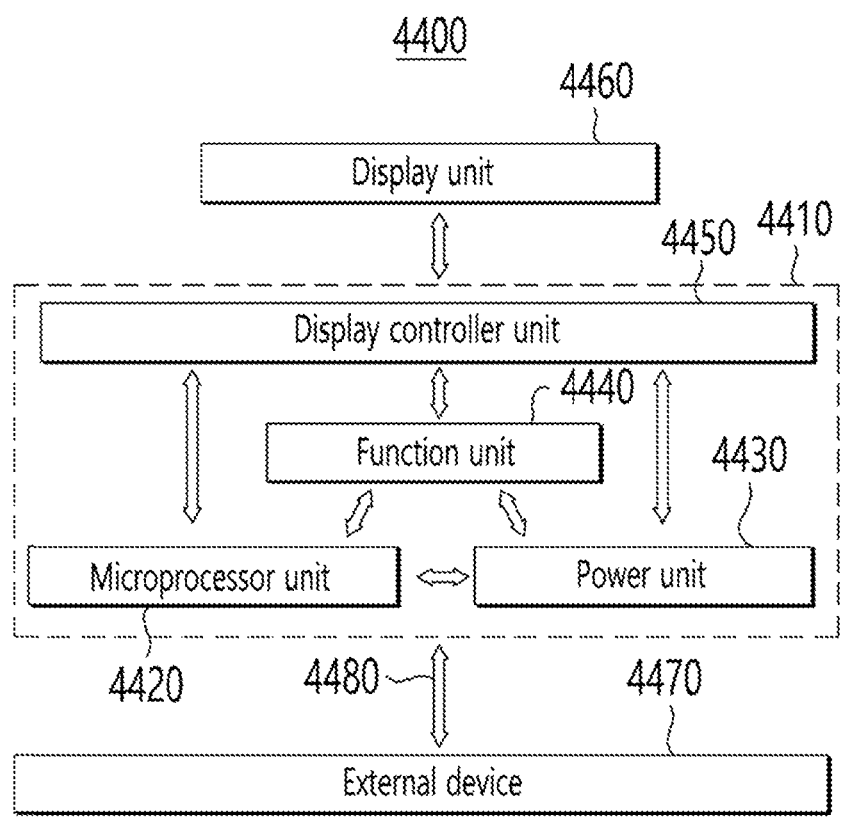
FIG. 9 is a block diagram illustrating an electronic system 4400 including a non-volatile memory apparatus in accordance with various embodiments.

Descriptions with reference to FIGS. 8 and 9 will be examples of the implementations and modifications of the electronic device 4200.

FIG. 8 is a block diagram illustrating a data storage device including a non-volatile memory apparatus in accordance with various embodiments. Referring to FIG. 8, a data storage device may be provided such as the solid state disk (SSD) 4311. The SSD 4311 may include an interface 4313, a controller 4315, a nonvolatile memory 4318, and a buffer memory 4319.

The SSD 4311 stores data through a semiconductor apparatus. The SSD 4311 has an advantage over the hard disk drive (HDD) since the SSD 4311 operates faster and is friendly to miniaturization and weight-lightening while having low mechanical delay or failure rate, low heating and low noise. The SSD 4311 may be widely used in a notebook PC, a netbook, a desktop PC, a MP3 player, or a portable storage device.

The controller 4315 may be disposed near to the interface 4313 and may be electrically coupled to the interface 4313. The controller 4315 may be a microprocessor including a memory controller and a buffer controller. The non-volatile memory 4318 may be disposed near to the controller 4315 and may be electrically coupled to the controller 4315 through a connection terminal T. Data storage capacity of the SSD 4311 may correspond to that of the non-volatile memory 4318. The buffer memory 4319 may be disposed near to the controller 4315 and may be electrically coupled to the controller 4315.

The interface 4313 may be coupled to a host 4302 and configured to transfer an electrical signal such as data. For example, the interface 4313 may conform to a protocol such as SATA, IDE, SCSI, and/or combination thereof. The non-volatile memory 4318 may be coupled to the interface 4313 through the controller 4315.

The non-volatile memory 4318 may store data provided through the interface 4313. The non-volatile memory 4318 may include the non-volatile memory apparatus 1 in accordance with various embodiments. The non-volatile memory 4318 may maintain stored data even when power supply to the SSD 4311 is cut off.

The buffer memory 4319 may include a volatile memory. The volatile memory may be DRAM and/or SRAM. The buffer memory 4319 may operate faster than the non-volatile memory 4318.

The interface 4313 may process data faster than the non-volatile memory 4318. The buffer memory 4319 may temporarily store data. Data provided through the interface 4313 may be temporarily stored in the buffer memory 4319 via the controller 4315, and may be stored in the non-volatile memory 4318 at the data storage speed of the non-volatile memory 4318.

Among data stored in the non-volatile memory 4318, frequently accessed data may be read in advance from the non-volatile memory 4318 and temporarily stored in the buffer memory 4319. That is, the buffer memory 4319 may serve to increase effective operation speed of the SSD 4311 and reduce error rate of the SSD 4311.

FIG. 9 is a block diagram illustrating an electronic system 4400 including a non-volatile memory apparatus in accordance with various embodiments. Referring to FIG. 9, the electronic system 4400 may include a body 4410, a microprocessor unit 4420, a power unit 4430, a function unit 4440, and a display controller unit 4450.

The body 4410 may be a motherboard formed with the printed circuit board (PCB). The microprocessor unit 4420, the power unit 4430, the function unit 4440, and the display controller unit 4450 may be mounted on the body 4410. A display unit 4460 may be disposed in or outside the body 4410. For example, the display unit 4460 may be disposed on a surface of the body 4410 and display image processed by the display controller unit 4450.

The power unit 4430 may receive a predetermined voltage from an external battery, divide the provided voltage into required voltages of various levels, and provide the divided voltages to the microprocessor unit 4420, the function unit 4440, the display controller unit 4450 and so forth. The microprocessor unit 4420 may receive the divided voltage from the power unit 4430 and may control the function unit 4440 and the display unit 4460. The function unit 4440 may perform various functions of the electronic system 4400. For example, if the electronic system 4400 is a cellular phone, the function unit 4440 may include various element capable of cellular phone functions such as dialing, image output to the display unit 4460 and voice output to a speaker through communication with an external device 4470 and so forth, and may function as a camera image processor when a camera is mounted in the electronic system 4400.

If the electronic system 4400 is coupled to a memory card for storage capacity expansion, the function unit 4440 may be a memory card controller. The function unit 4440 may exchange signals with the external device 4470 through a wired or wireless communication unit 4480. If the electronic system 4400 requires a device such as a universal serial bus (USB) storage device for function expansion, the function unit 4440 may work as an interface controller. The non-volatile memory apparatus 1 in accordance with various embodiments may be applied to one or more of the microprocessor unit 4420 and the function unit 4440.

While certain embodiments have been described above, it will be understood to those skilled in the art that the embodiments described are by way of example only. Accordingly, the sense amplifier, non-volatile memory apparatus and system including the same should not be limited based on the described embodiments. Rather, the sense amplifier, non-volatile memory apparatus and system including the same described herein should only be limited in light of the claims that follow when taken in conjunction with the above description and accompanying drawings.

What is claimed is:

1. A sense amplifier comprising:
  a current supply unit configured to provide a sensing current to a sensing node;
  an amplification unit configured to receive a read reference voltage through a first input portion thereof, to be coupled to a global bit line at a second input portion thereof, and to compare the read reference voltage with a voltage level of the global bit line and amplify a voltage difference between the read reference voltage with the voltage level of the global bit line;
  a pass transistor configured to transfer a current from the sensing node to the global bit line based on a signal output from an output portion of the amplification unit; and
  a latch unit configured to generate an output signal by detecting a voltage level of the sensing node, and to block current supply to the global bit line based on the output signal.

2. The sense amplifier of claim 1, wherein the current supply unit includes a clamping current source, and adjusts an amount of the sensing current by adjusting an amount of a current flowing through the clamping current source.

3. The sense amplifier of claim 2, wherein the current supply unit further includes a precharge switch configured to provide a precharge current to the sensing node based on a precharge signal, and an amount of the precharge current is greater than that of the sensing current.

4. The sense amplifier of claim 1, wherein the latch unit includes a detection portion configured to generate the output signal by detecting the voltage level of the sensing node when a latch enable signal is enabled.

5. The sense amplifier of claim 4, wherein the latch unit further includes a current switch configured to couple the second input portion of the amplification unit to the global bit line based on a sensing enable signal.

6. The sense amplifier of claim 5, wherein the latch unit disables the sensing enable signal based on the output signal, and the current switch de-couples the second input portion of the amplification unit from the global bit line when the sensing enable signal is disabled.

7. The sense amplifier of claim 4, wherein the latch unit further includes a discharge portion configured to discharge the global bit line based on a detection result of the detection portion.

8. The sense amplifier of claim 1, wherein the pass transistor has a gate coupled to the output portion of the amplification unit, a drain coupled to the sensing node, and a source coupled to the global bit line.

9. The sense amplifier of claim 1, wherein the pass transistor provides a greater amount of current to the global bit line as the voltage level of the global bit line becomes lower, and provides a smaller amount of current to the global bit line as the voltage level of the global bit line becomes higher.

10. A sense amplifier comprising:
  a current supply unit configured to provide a sensing current to a sensing node based on a power supply voltage;
  a first current clamping unit configured to adjust an amount of the sensing current based on a read reference voltage;
  an amplification unit configured to receive the read reference voltage through a first input portion thereof, to be coupled to a global bit line at a second input portion thereof, and to compare the read reference voltage with a voltage level of the global bit line and amplify a voltage difference between the read reference voltage with the voltage level of the global bit line;
  a second current clamping unit configured to adjust an amount of a current provided to the global bit line based on the voltage level of the global bit line;
  a pass transistor configured to couple the sensing node to the global bit line based on a signal output from an output portion of the amplification unit; and
  a latch unit configured to generate an output signal by detecting a voltage level of the sensing node.

11. The sense amplifier of claim 10, wherein the current supply unit further includes a precharge switch configured to provide a precharge current to the sensing node based on a precharge signal, and an amount of the precharge current is greater than that of the sensing current.

12. The sense amplifier of claim 10, wherein the pass transistor has a gate coupled to the output portion of the amplification unit, a drain coupled to the sensing node, and a source coupled to the global bit line.

13. The sense amplifier of claim 10, wherein the latch unit includes a detection portion configured to generate the output signal by detecting the voltage level of the sensing node when a latch enable signal is enabled.

14. The sense amplifier of claim 13, wherein the latch unit further includes a current switch configured to couple the second input portion of the amplification unit to the global bit line based on a sensing enable signal.

15. The sense amplifier of claim 14, wherein the latch unit disables the sensing enable signal based on the output signal, and the current switch de-couples the second input portion of the amplification unit from the global bit line when the sensing enable signal is disabled.

16. The sense amplifier of claim 13, wherein the latch unit further includes a discharge portion configured to discharge the global bit line based on a detection result of the detection portion.

17. A memory apparatus comprising:
a sense amplifier comprising:
a current supply unit configured to provide a sensing current to a sensing node;
an amplification unit configured to receive a read reference voltage through a first input portion thereof, to be coupled to a global bit line at a second input portion thereof, and to compare the read reference voltage with a voltage level of the global bit line and amplify a voltage difference between the read reference voltage with the voltage level of the global bit line;
a pass transistor configured to transfer a current from the sensing node to the global bit line based on a signal output from an output portion of the amplification unit; and
a latch unit configured to generate an output signal by detecting a voltage level of the sensing node, and to block current supply to the global bit line based on the output signal;
a column switch coupled to the sense amplifier through the global bit line; and
a memory cell coupled to the column switch through a bit line.

18. The memory apparatus of claim 17, wherein the column switch is configured to couple the global bit line to the bit line and the memory cell coupled to the bit line based on a column selection signal.

19. The memory apparatus of claim 17,
wherein the pass transistor provides a smaller amount of current to the global bit line when the memory cell has a low resistance status or the memory cell has stored a set data, and
wherein the pass transistor provides a greater amount of current to the global bit line when the memory cell has a high resistance status and/or the memory cell has stored a reset data.

* * * * *